(12) United States Patent
Tsuchiya

(10) Patent No.: US 7,612,868 B2
(45) Date of Patent: Nov. 3, 2009

(54) EXPOSURE APPARATUS AND METHOD OF MANUFACTURING DEVICE

(75) Inventor: Go Tsuchiya, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/144,980

(22) Filed: Jun. 24, 2008

(65) Prior Publication Data

US 2009/0002666 A1  Jan. 1, 2009

(30) Foreign Application Priority Data

Jun. 28, 2007  (JP) ............................. 2007-171223

(51) Int. Cl.
*G03B 27/72* (2006.01)
*G03B 27/42* (2006.01)

(52) U.S. Cl. .......................................... 355/69; 355/53

(58) Field of Classification Search .................. 355/53, 355/67–71, 399–401; 250/458
See application file for complete search history.

(56) References Cited

U.S. PATENT DOCUMENTS 5,534,970 A * 7/1996 Nakashima et al. ........... 355/53

7,098,992 B2 * 8/2006 Ohtsuki et al. ............... 355/69
7,154,922 B2 * 12/2006 Hattori .................... 372/29.01

FOREIGN PATENT DOCUMENTS

| JP | 64-077123 A | 3/1989 |
| JP | 06-252021 A | 9/1994 |
| JP | 09186074 | * 7/1997 |
| JP | 11-162824 A | 6/1999 |
| JP | 2004-537176 A | 12/2004 |
| WO | 03/011595 A | 2/2003 |

* cited by examiner

*Primary Examiner*—Hung Henry Nguyen
(74) *Attorney, Agent, or Firm*—Canon U.S.A., Inc., IP Division

(57) ABSTRACT

An exposure apparatus which exposes a substrate to pulsed light supplied from a light source, includes an input device, and a controller configured to periodically change a wavelength of the pulsed light emitted by the light source, wherein the controller is configured to calculate number of pulsed light required to expose each point on the substrate based on a parameter input from the input device, and configured to determine a changing period of the wavelength based on the calculated number.

8 Claims, 6 Drawing Sheets

F I G. 4
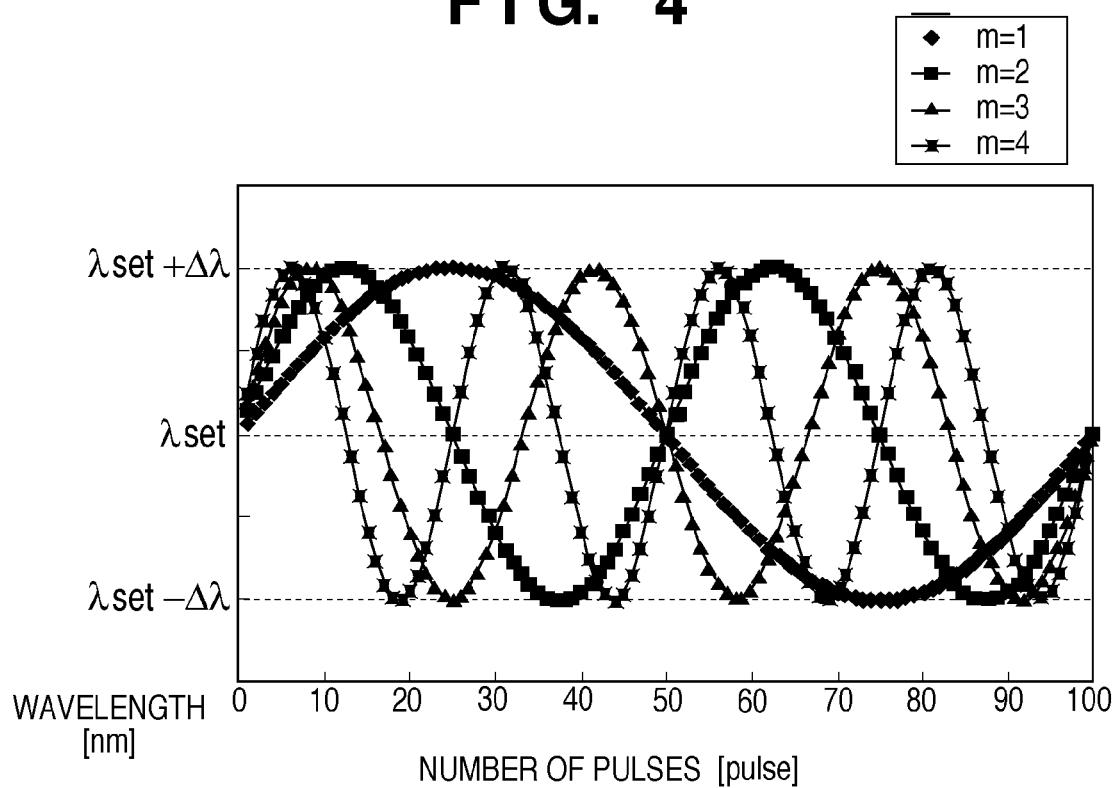
F I G. 5
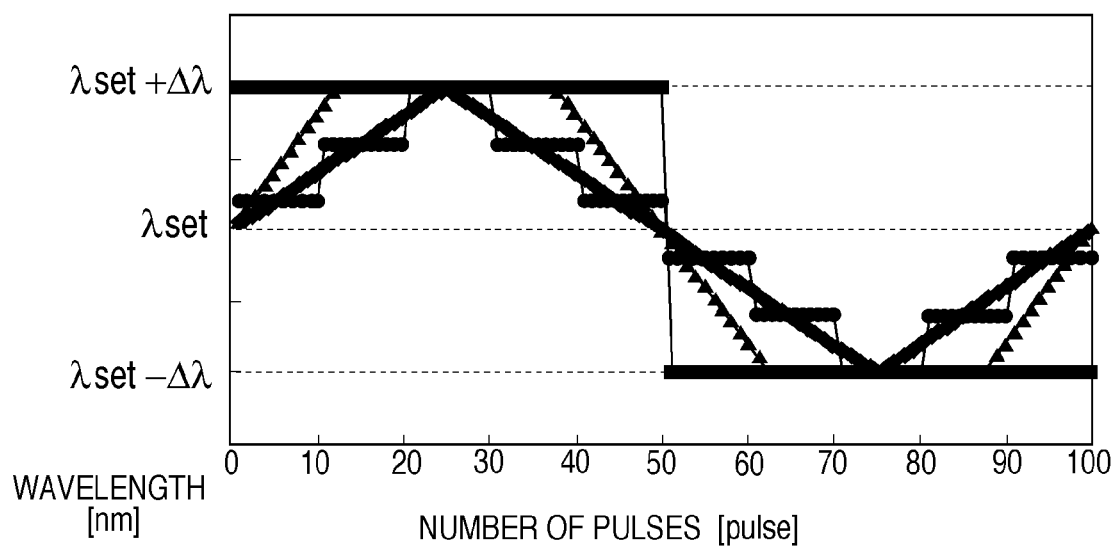

EXPOSURE APPARATUS AND METHOD OF MANUFACTURING DEVICE

BACKGROUND OF THE INVENTION

1. Field of the Invention

The present invention relates to an exposure apparatus which exposes a substrate to pulsed light supplied from a light source, and a method of manufacturing a device using the same.

2. Description of the Related Art

An exposure apparatus is employed in lithography for manufacturing a device such as a semiconductor device. The exposure apparatus illuminates an original by an illumination optical system with light supplied from a light source to project the pattern of the original onto a substrate via a projection optical system, thereby exposing the substrate.

The resolution of the exposure apparatus is known to be proportional to a wavelength λ of light emitted by the light source, and inversely proportional to a numerical aperture NA of the projection optical system as given by:

$$\text{resolution} = k1 \cdot (\lambda/NA) \quad (1)$$

where k1 is a proportionality constant.

To improve the resolution of the exposure apparatus, it is only necessary to shorten the wavelength of light emitted by the light source or increase the numerical aperture of the projection optical system.

One characteristic of the projection optical system of the exposure apparatus is the depth of focus (DOF). The depth of focus expresses the allowable range of blurring of an image projected onto the substrate by the distance from the focal point. The depth of focus can be expressed by:

$$DOF = k2 \cdot (\lambda/NA^2) \quad (2)$$

where k2 is a proportionality constant.

As the wavelength of light emitted by the light source is shortened or the numerical aperture of the projection optical system is increased in order to improve the resolution of the exposure apparatus, the depth of focus decreases accordingly. Such a decrease in depth of focus is a serious problem especially for the next-generation devices being developed aiming at higher packing densities by the miniaturization and three-dimensional design of circuit patterns. That is, because the three-dimensional design of a circuit pattern amounts to increasing the dimension of the formed structure in the optical axis direction, a decrease in depth of focus disturbs the three-dimensional design of a circuit pattern.

To solve the above-described problem, an attempt has been made to increase the depth of focus by imaging an original pattern at a plurality of positions on the same optical axis with exposure light containing a plurality of wavelength components.

Japanese Patent Registration No. 02619473 discloses a technique of providing a light source for emitting a light beam with a first wavelength and a light source for emitting a light beam with a second wavelength, and combining these light beams, thereby using the combined light as exposure light.

Japanese Patent Laid-Open No. 11-162824 discloses a technique of inserting a filter for selectively transmitting light beams in a plurality of wavelength ranges into the optical path between the light source and the substrate, thereby using the transmitted light as exposure light with a plurality of wavelength components.

Japanese Patent Laid-Open No. 06-252021 discloses a technique of changing the wavelength of light emitted by the light source during the cumulative exposure of the substrate to pulsed light. FIGS. 1 and 2 are graphs each illustrating the spectral distribution of pulsed light in cumulative exposure.

In recent years, it has become possible to periodically change the wavelength between −Δλ and +Δλ at high speed. However, Japanese Patent Laid-Open No. 06-252021 neither discloses nor suggests details of how to determine the changing period of the wavelength of pulsed light emitted by the light source.

If the wavelength changing period is inappropriate, it is impossible to obtain a spectral distribution with a high symmetry as shown in FIGS. 1 and 2 in cumulative exposure with a plurality of pulsed light beams. In this case, the best focus position is offset in the optical axis direction, resulting in a decrease in depth of focus.

SUMMARY OF THE INVENTION

The present invention has been made in consideration of the above-described background, and has as its exemplary object to appropriately set the wavelength changing period.

The first aspect of the present invention is directed to an exposure apparatus which exposes a substrate to pulsed light supplied from a light source, and the apparatus comprises an input device, and a controller configured to periodically change a wavelength of the pulsed light emitted by the light source, wherein the controller is configured to calculate number of pulsed light required to expose one shot region on the substrate based on a parameter input from the input device, and configured to determine a changing period of the wavelength based on the calculated number.

The second aspect of the present invention is directed to an exposure apparatus which exposes a scanned substrate via an original to slit-shaped exposure light formed from pulsed light supplied from a light source, and the apparatus comprises an input device, and a controller configured to periodically change a wavelength of the pulsed light emitted by the light source, wherein the controller is configured to set an oscillation frequency of the light source, a speed of scanning of the substrate, and a width of the slit-shaped exposure light in a direction of the scanning based on a parameter input from the input device, and to determine a changing period of the wavelength based on the set values.

According to the present invention, it is possible to appropriately set, e.g., the wavelength changing period.

Further features of the present invention will become apparent from the following description of exemplary embodiments with reference to the attached drawings.

BRIEF DESCRIPTION OF THE DRAWINGS

FIG. 4 is a graph showing an example in which the wavelength is periodically changed between −Δλ and +Δλ assuming $\lambda_{set}$ as the center wavelength;

FIG. 5 is a graph showing an example of the shapes of waves other than sine waves in periodically changing the wavelength;

DESCRIPTION OF THE EMBODIMENTS

Preferred embodiments of the present invention will be described below with reference to the accompanying drawings.

First Embodiment

Figure 3:
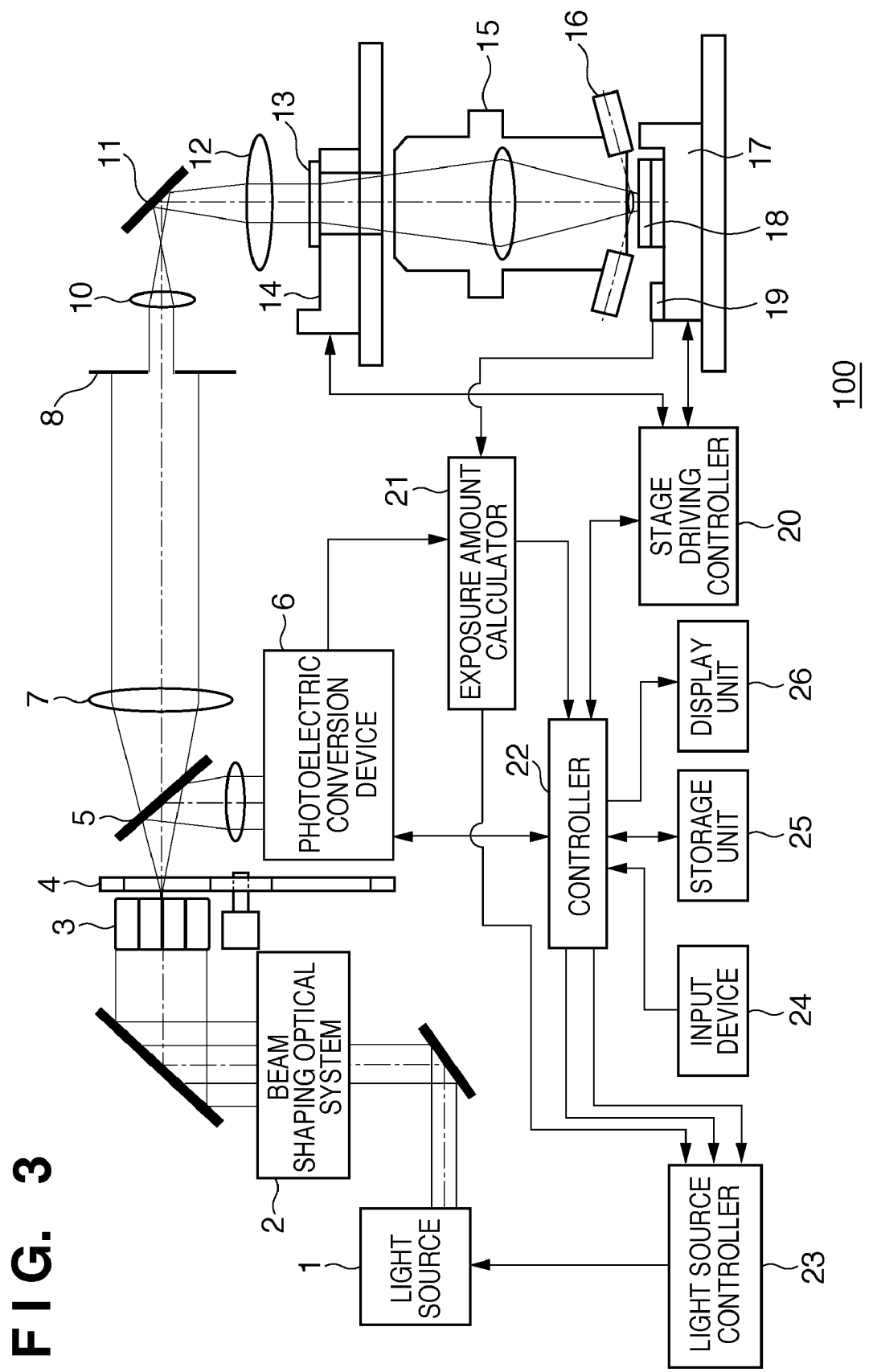
FIG. 3 is a diagram schematically showing the arrangement of an exposure apparatus according to the first embodiment of the present invention.

FIG. 3 is a diagram schematically showing the arrangement of an exposure apparatus according to the first embodiment of the present invention. In this embodiment, an exposure apparatus 100 transfers the pattern of an original (also called a reticle or mask) 13 onto a substrate 18 while the original 13 and substrate 18 are set still.

The exposure apparatus 100 according to this embodiment exposes the substrate 18 to pulsed light supplied from a light source (laser) 1. The exposure apparatus 100 comprises a controller 22 to periodically change the wavelength of pulsed light emitted by the light source 1. The controller 22 determines the wavelength changing period based on the number of pulsed light beams required to expose one short region on the substrate 18. The pulsed light means light whose intensity exhibits a pulse-like change.

Let N be the number of pulsed light beams required to expose one shot region on the substrate, and m be a natural number. Then, the controller 22 can determine the wavelength changing period as the time during which pulsed light beams in a number determined based on the value of N/m are generated. If the value of N/m is not an integer, the controller 22 can determine the wavelength changing period as the time during which pulsed light beams in a number obtained by rounding down, rounding up, or rounding off the value of N/m to the nearest whole number are generated.

The operation of the exposure apparatus 100 will be explained in more detail. Pulsed light emitted by the light source (laser) 1 is shaped into a predetermined shape upon passing through a beam shaping optical system 2, and enters the light incident surface of an optical integrator 3. The optical integrator 3 includes a plurality of microlenses and forms a large number of secondary sources near its light exit surface.

The pulsed light which emerges from the optical integrator 3 travels toward a condenser lens 7 upon passing through a stop buried in a stop turret 4. The stop limits the sizes of the secondary sources. Aperture stops which have different circular aperture areas and are used to set a plurality of coherence factors σ, a ring-like stop for annular illumination, a quadrupole stop for quadrupole illumination, and the like are numbered (with illumination mode numbers) and buried in the stop turret 4. A stop required to change the illumination light intensity distribution (effective light source distribution) is selectively inserted into the optical path.

A first photoelectric conversion device 6 detects the amount of pulsed light which is reflected by a half mirror 5 and extracted outside the optical path, and outputs the detection result to an exposure amount calculator 21.

The condenser lens 7 Kohler-illuminates a blind 8 with the pulsed light beams which emerge from the secondary sources formed near the exit surface of the optical integrator 3. The opening region of the blind 8 has a figure similar to that of a desired pattern exposure region of the original 13 at an optical magnification. In exposure, the blind 8 shields a region other than the exposure region of the original 13 against light. The pulsed light having passed through the blind 8 illuminates the original 13 via a condenser lens 10, mirror 11, and condenser lens 12.

The original 13 is held by an original stage 14. The pattern of the original 13 is projected onto the substrate 18 via a projection optical system 15, thereby exposing the substrate 18. A focus detection system 16 detects the level and tilt of the surface of the substrate 18 held by a substrate stage 17. In exposure, the surface of the substrate 18 is focused onto the image plane of the projection optical system 15 based on the pieces of information obtained by the focus detection system 16.

A second photoelectric conversion device 19 is arranged on the substrate stage 17 and detects the pulsed light amount.

The control system configuration of the exposure apparatus 100 will be explained. A stage controller 20 controls the driving of the original stage 14 and substrate stage 17. The exposure amount calculator 21 converts the light amount detection results obtained by the first photoelectric conversion device 6 and second photoelectric conversion device 19 into logical values, and outputs them to the controller 22. The first photoelectric conversion device 6 can detect the light amount even during substrate exposure. The second photoelectric conversion device 19 detects the amount of pulsed light which strikes the substrate 18 before an exposure process. At the same time, a correlation between the pulsed light amounts detected by the second photoelectric conversion device 19 and first photoelectric conversion device 6 is calculated. Based on the calculated correlation, the exposure amount calculator 21 converts the value output from the first photoelectric conversion device 6 into a light amount on the substrate 18, and determines it as a monitoring light amount for exposure amount control.

A light source controller 23 controls the oscillation frequency and output energy of the light source 1 in accordance with parameters (commands) sent from the controller 22. The control of the light source 1 by the light source controller 23 includes controlling the changing period of the wavelength of pulsed light emitted by the light source 1, in accordance with the wavelength changing period determined by the controller 22.

Exposure parameters (e.g., the cumulative exposure amount, cumulative exposure amount accuracy, and stop shape) are input to the controller 22 via an input device 24 and stored in a storage unit 25. A display unit 26 can display, e.g., the setting state and internal state of the exposure apparatus 100.

The controller 22 calculates exposure control parameters based on the data sent from the input device 24, parameters unique to the exposure apparatus 100, and the outputs from measuring devices such as the first photoelectric conversion device 6 and second photoelectric conversion device 19. The calculated parameters are transmitted to the light source controller 23 and stage controller 20.

The determination of exposure parameters by the controller 22 will be explained. The parameters include a target pulsed light amount P required to control the light source 1, a number N of pulses required for exposure, and a changing period $N_\lambda$ of the wavelength of pulsed light emitted by the light source 1.

First, an appropriate exposure amount of the substrate 18 is input to the input device 24. The appropriate exposure amount can be input as a part of, e.g., a recipe file.

Next, the illuminance on the exposure surface of the substrate 18 is measured. The first photoelectric conversion device 6 whose correlation with the pulsed light amount P [J/m²·pulse] on the exposure surface of the substrate 18 is known can be used to measure the illuminance on the exposure surface of the substrate 18. The second photoelectric conversion device 19 on the substrate stage 17 may be used to measure the illuminance on the exposure surface of the substrate 18.

After the measurement of the pulsed light amount P is completed, the exposure amount control parameters are determined in the following way. For the sake of simplicity, a case in which a variation in the pulsed light amount P is so small that the pulsed light amount P can be regarded as being constant will be exemplified hereinafter.

The number N of pulses required for exposure is given by:

$$N = D/P \quad (3)$$

where D [J/m²] is the appropriate exposure amount of the substrate 18, and P is the pulsed light amount.

Because N is inevitably an integer in an exposure apparatus which performs full-plate exposure while an original and substrate are set still, D/P is controlled to an integer by finely adjusting the pulsed light amount P. This operation can be done by finely adjusting the transmittance of a dimming optical element (not shown) which can be inserted between the beam shaping optical system 2 and the optical integrator 3 shown in FIG. 3, finely adjusting the amount of pulsed light from the light source 1, or finely adjusting both the pulsed light amount and the transmittance of the dimming optical element.

The wavelength changing period $N_\lambda$ is expressed by:

$$N_\lambda = N/m \quad (4)$$

where N is the number of pulsed light beams required to expose one shot region of the substrate, and m is a natural number of 1 or more, which can be input to the controller 22 via the input device 24 as a part of, e.g., a recipe file in advance. m may be an optimal value which is calculated in accordance with a resolution predicted by simulation or calculated in accordance with a resolution evaluated based on an actual exposure result.

FIG. 4 is a graph showing an example in which the wavelength is periodically changed between $-\Delta\lambda$ and $+\Delta\lambda$ assuming $\lambda_{set}$ as the center wavelength. More specifically, N=100 and m=1, 2, 3, 4 in equation (4). The abscissa indicates the number of pulsed light beams emitted by the light source 1, and the ordinate indicates the wavelength. The wavelength changing period changes depending on m. In this example, when m=3, $N_\lambda$=33.333 . . . , i.e., $N_\lambda$ has fractions after the decimal point. To solve this problem, $N_\lambda$ is rounded off to the nearest whole number, i.e., 34. Note that $N_\lambda$ may be rounded down or rounded up to the nearest whole number to omit the fractions after the decimal point.

FIG. 5 is a graph showing an example of the shapes of waves other than sine waves in periodically changing the wavelength. Various types of waves such as a triangular wave, rectangular wave, and trapezoidal wave are selected in accordance with the required resolution.

Figure 1:
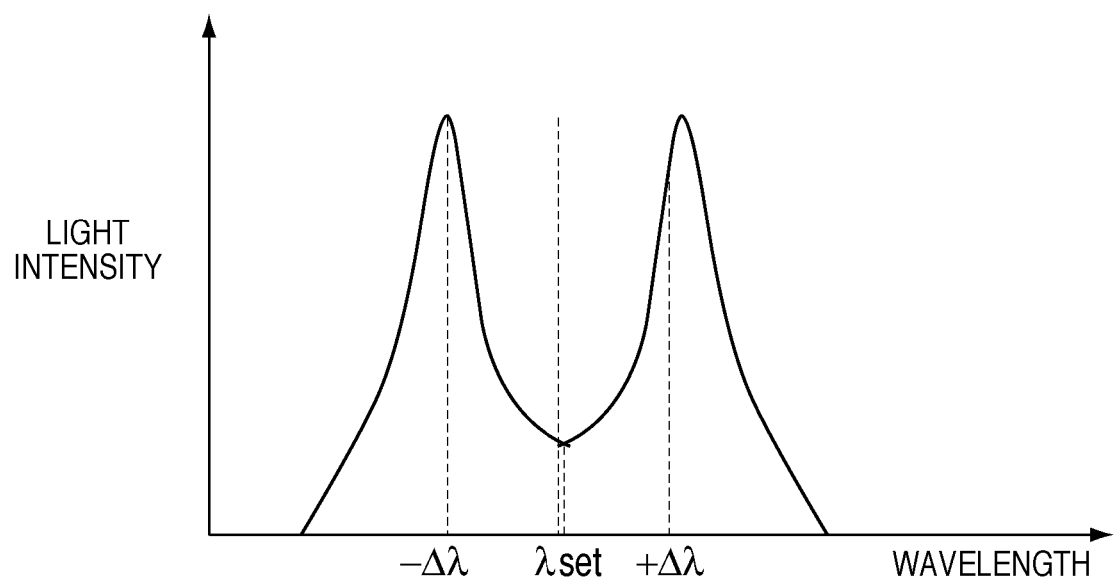
FIG. 1 is a graph illustrating the spectral distribution of pulsed light in cumulative exposure.
Figure 2:
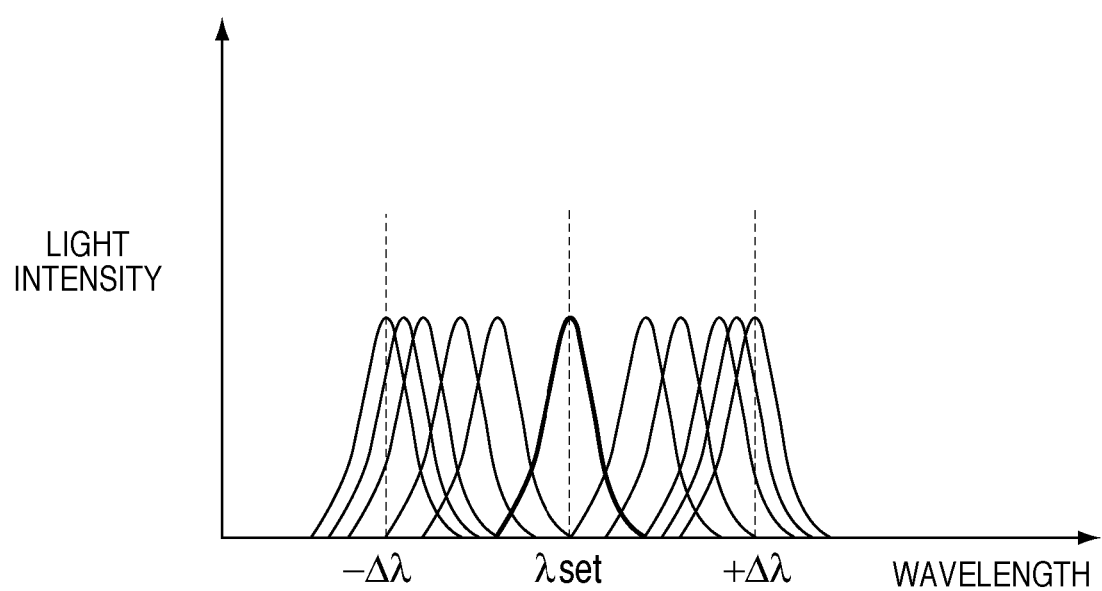
FIG. 2 is a graph illustrating the spectral shape upon dropping down a plurality of wavelengths for each pulse.
Figure 6:
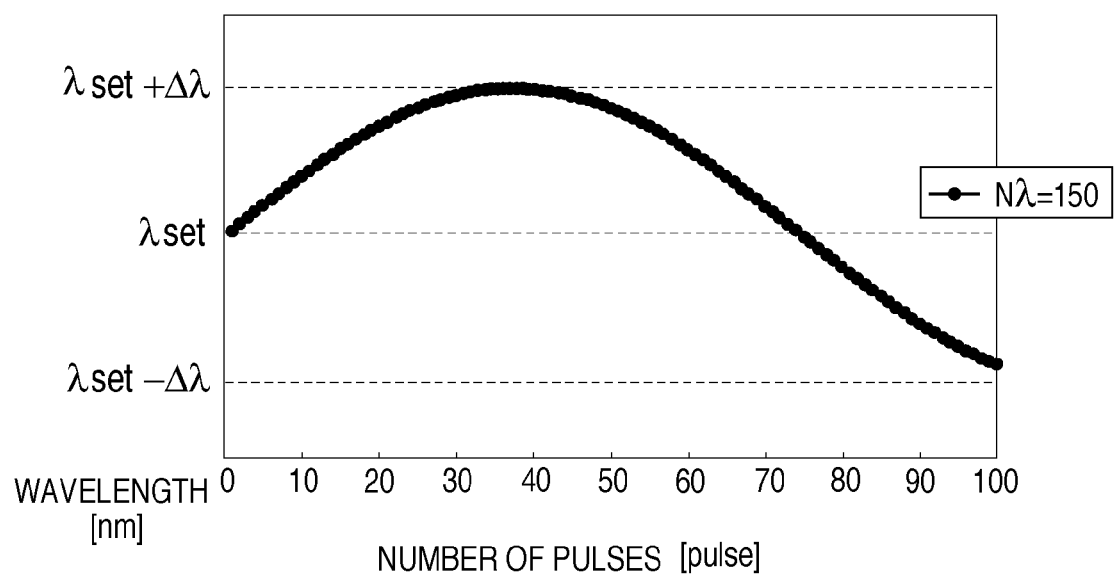
FIG. 6 is a graph showing an example in which the wavelength changing period with respect to the number of oscillated pulses is set inappropriately.
Figure 7:
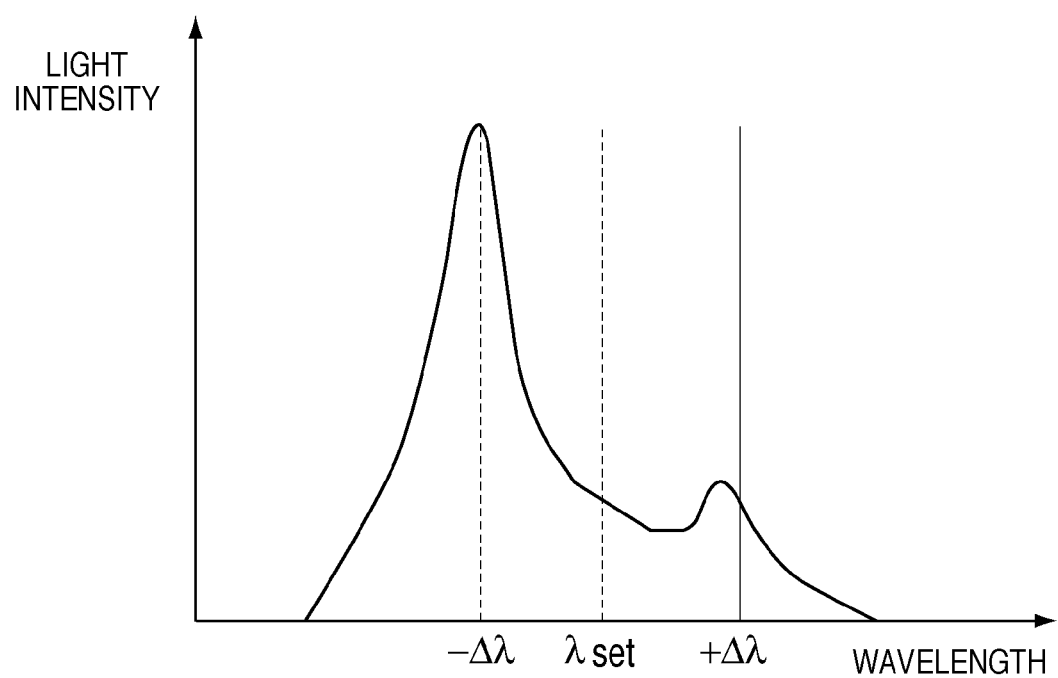
FIG. 7 is a graph illustrating an asymmetrical spectral distribution.

FIG. 6 shows a wavelength changing period which largely deviates from equation (4). Note that N=100 and $N_\lambda$=150. The spectral distribution in cumulative exposure by 100 pulses is asymmetrical as shown in FIG. 7, which is largely different from a distribution symmetrical about the center wavelength $\lambda_{set}$ as the center as shown in FIG. 1. Consequently, the depth of focus does not improve.

The wavelength changing period $N_\lambda$ calculated by the controller 22 in accordance with equation (4) is sent to the light source controller 23. The controller 22 also sends a wavelength oscillation width $\Delta\lambda$ and center wavelength $\lambda_{set}$ to the light source controller 23. Based on the pieces of information sent from the controller 22, the light source controller 23 designates a pulse-specific target wavelength $\lambda$ for the light source 1 using a parallel signal line or serial communication line while oscillating each laser pulse from the light source 1. Alternatively, the light source controller 23 may transmit the wavelength changing period $N_\lambda$, wavelength oscillation width $\Delta\lambda$, and center wavelength $\lambda_{set}$ to the light source 1 using a serial signal line in advance, so that the light source 1 itself periodically changes the target wavelength $\lambda$ only by oscillating pulses from the light source 1 by the light source controller 23.

According to the first embodiment of the present invention, the depth of focus can be improved because a spectral distribution with a high symmetry is obtained in cumulative exposure with a plurality of pulsed light beams. In addition, manufacturing variations between shot regions due to differences in best focus position between the shot regions can be reduced.

Second Embodiment

Figure 10:
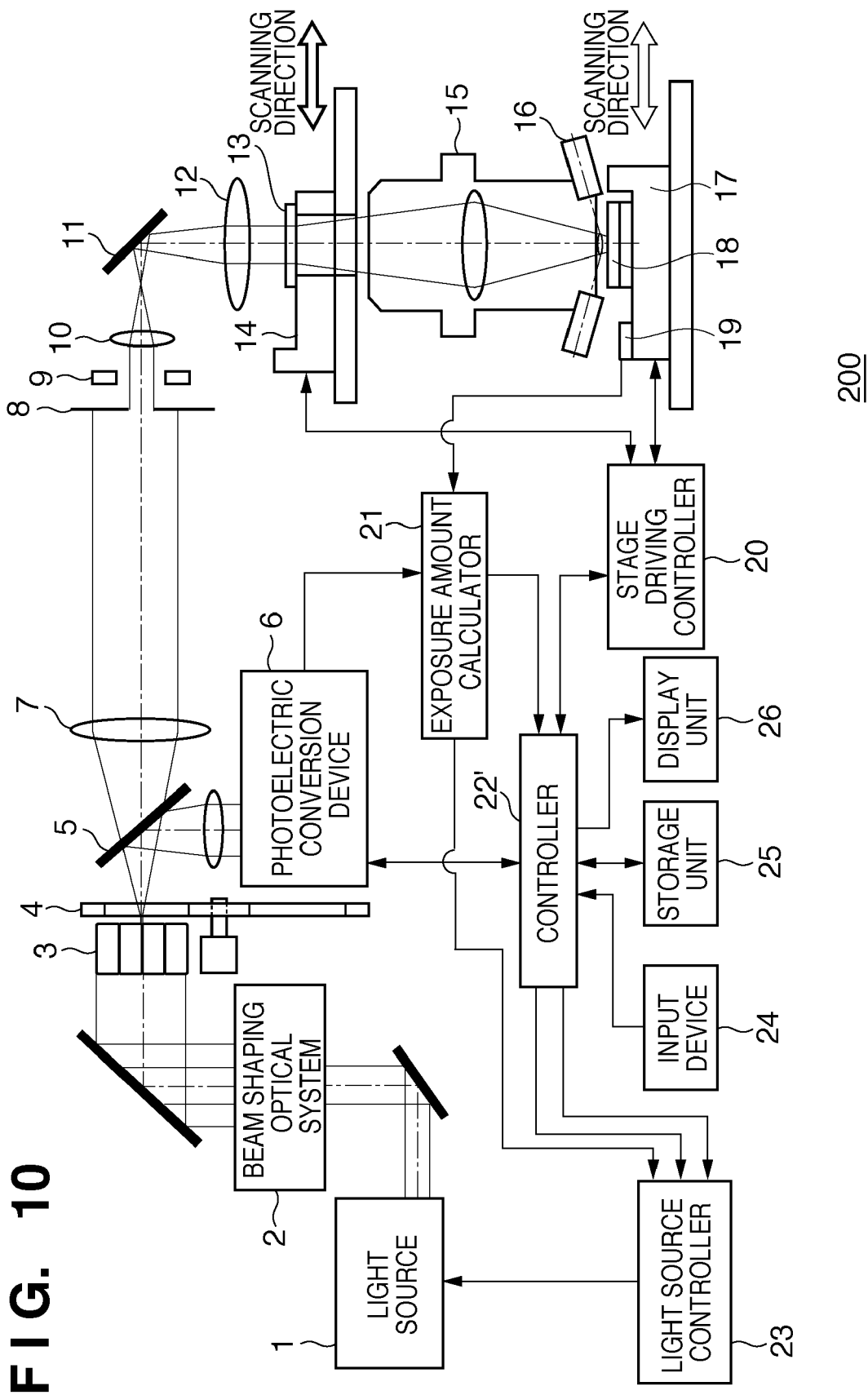
FIG. 10 is a diagram schematically showing the arrangement of an exposure apparatus according to the second embodiment of the present invention.

FIG. 10 is a diagram schematically showing the arrangement of an exposure apparatus according to the second embodiment of the present invention. In this embodiment, an exposure apparatus 200 projects the pattern of an original 13 onto a substrate 18 with slit-shaped exposure light formed using pulsed light supplied from a light source 1, thereby scanning and exposing the substrate 18. The same reference numerals as in FIG. 3 denote the same constituent elements in FIG. 10.

Parts different from those in the first embodiment will be mainly explained herein. A slit 9 is inserted near a blind 8 and shapes pulsed light having passed through the blind 8 into slit-shaped (e.g., rectangular or arcuated) exposure light. The slit-shaped exposure light illuminates the original 13 via a condenser lens 10, mirror 11, and condenser lens 12.

In exposure, an original stage 14 and substrate stage 17 are synchronously scanned while focusing the surface of the substrate 18 onto the image plane of a projection optical system 15 based on information obtained by a focus detection system 16.

The exposure apparatus 200 projects the pattern of the original 13 onto the substrate 18 with slit-shaped exposure light formed using pulsed light supplied from the light source 1, thereby scanning and exposing the substrate 18. The exposure apparatus 200 comprises a controller 22' to periodically change the wavelength of pulsed light emitted by the light source 1. The controller 22' determines the wavelength changing period based on the oscillation frequency of the light source 1, the scanning speed of the substrate 18, and the dimension, in the scanning direction, of the slit-shaped exposure light which strikes the substrate 18.

The determination of exposure parameters by the controller 22' will be explained. The parameters include, e.g., a target pulsed light amount P required to control the light source 1, an oscillation frequency f [Hz] of the light source 1, a scanning speed v [mm/sec] of the substrate stage 17, and a wavelength changing period $N_\lambda$.

First, an appropriate exposure amount of the substrate 18 is input to an input device 24. The appropriate exposure amount can be input as a part of, e.g., a recipe file.

Next, the illuminance on the exposure surface of the substrate 18 is measured. A first photoelectric conversion device 6 whose correlation with the pulsed light amount P [J/m²·pulse] on the exposure surface of the substrate 18 is known can be used to measure the illuminance on the exposure surface of the substrate 18. A second photoelectric conversion device 19 on the substrate stage 17 may be used to measure the illuminance on the exposure surface of the substrate 18.

An illuminance I [W/m²] on the exposure surface of the substrate 18 is given by:

$$I = P \cdot f \quad (5)$$

An appropriate exposure amount D of the substrate 18 is given by:

$$D = I \cdot t \quad (6)$$

where t [sec] is the exposure time.

The exposure time t is given by:

$$t = L/v \quad (7)$$

where L [mm] is the dimension, in the scanning direction, of the slit-shaped exposure light on the exposure surface of the substrate 18, and v [m/sec] is the scanning speed of the substrate 18.

From equations (5), (6), and (7), we have:

$$D = P \cdot L \cdot f / v \quad (8)$$

It is important in scanning exposure to adjust the pulsed light amount P, oscillation frequency f, and scanning speed v to fall within variable ranges in equation (8).

The wavelength changing period $N_\lambda$ in scanning exposure is defined by:

$$N_\lambda = L \cdot f / (v \cdot m) \quad (9)$$

where m is a natural number of 1 or more.

If the calculation result of $N_\lambda$ in equation (9) is not an integer, a value obtained by rounding off, rounding down, or rounding up $N_\lambda$ to the nearest whole number is determined as $N_\lambda$ instead.

Figure 8:
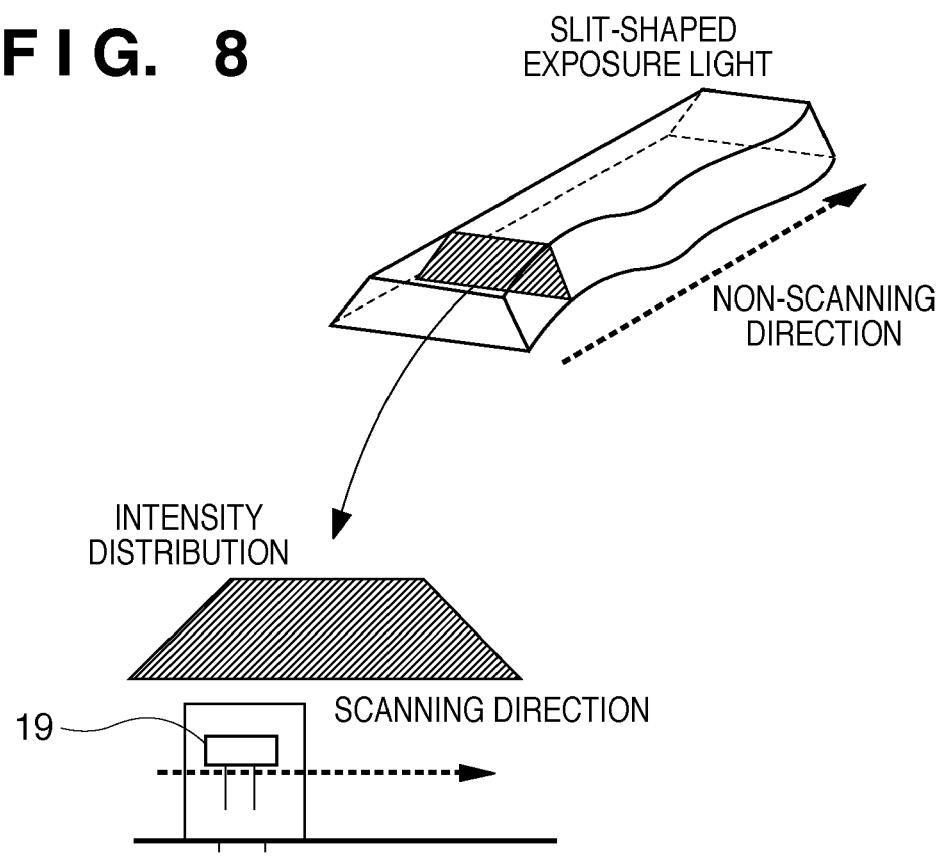
FIG. 8 is a diagram illustrating slit-shaped exposure light and its intensity distribution.

The dimension L [mm] of the slit-shaped exposure light in the scanning direction will be explained in more detail herein. FIG. 8 illustrates the slit-shaped exposure light and its intensity distribution in the scanning direction. This intensity distribution can be calculated based on, e.g., a design value. This intensity distribution may be obtained by measuring the exposure light while scanning the second photoelectric conversion device 19 as shown in FIG. 8.

Figure 9:
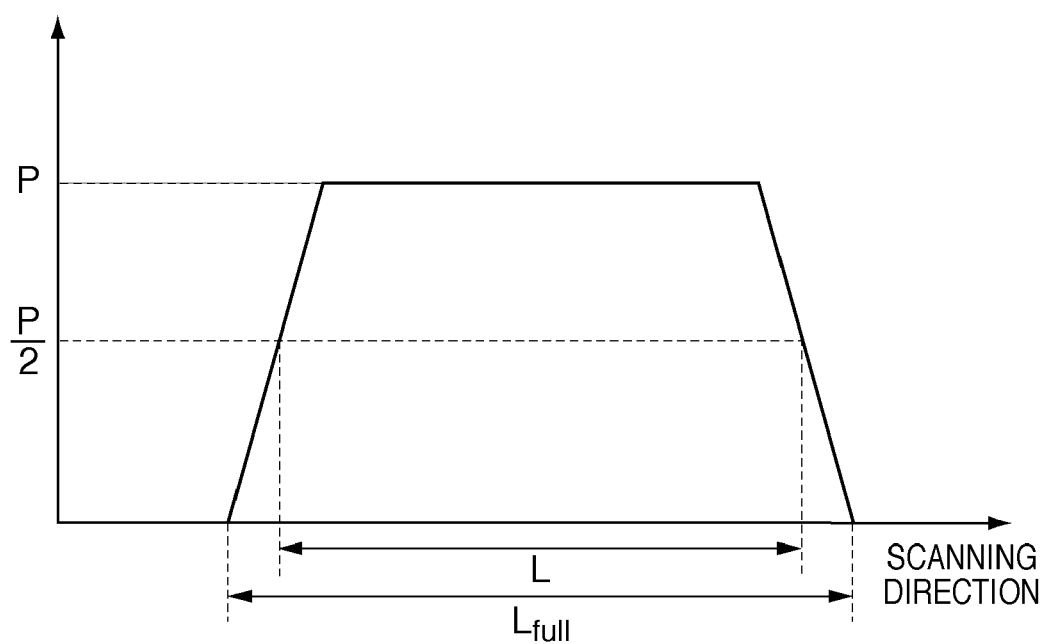
FIG. 9 is a graph illustrating the intensity distribution of the slit-shaped exposure light.

FIG. 9 is a graph illustrating a method of determining the dimension L [mm] of the slit-shaped exposure light in the scanning direction. This example assumes the dimension at which the light intensity is nearly half the peak intensity as L [mm]. Only a distribution portion at a certain position (e.g., the center position of the slit-shaped exposure light in the longitudinal direction (non-scanning direction)) of the slit-shaped exposure light in the longitudinal direction may be used. An intensity distribution obtained by averaging the overall region where the slit-shaped exposure light strikes the substrate may be used. An intensity distribution obtained by averaging the dimensions of the slit-shaped exposure light in the longitudinal direction at a plurality of positions may be used.

A wavelength changing period $N_\lambda$ may be calculated in the following way. First, a pulsed light amount P, oscillation frequency f, and scanning speed v are determined. The wavelength changing period $N_\lambda$ is calculated by:

$$N_\lambda = L_{full} \cdot f / (v \cdot m) \quad (10)$$

where $L_{full}$ [mm] is the width between the head and tail of the intensity distribution shown in FIG. 9.

Note that the width between the head and tail of the intensity distribution corresponds to a portion having approximately zero peak intensity.

By calculating $N_\lambda$ in the above-described way, the wavelength is changed at an approximate wavelength changing period even in the scanning exposure apparatus, thus improving the depth of focus.

According to the second embodiment of the present invention, the depth of focus can be improved because a spectral distribution with a high symmetry is obtained in cumulative exposure with a plurality of pulsed light beams. In addition, manufacturing variations between shot regions due to the difference in best focus position between the shot regions can be reduced.

APPLICATION EXAMPLE

A method of manufacturing a device according to a preferred embodiment of the present invention is suitable to manufacture a device such as a semiconductor device and liquid crystal device. The method of manufacturing a device can include a step of exposing a substrate coated with a photosensitive agent using the above-described exposure apparatus, a step of developing the substrate exposed in the exposing step, and other known steps of processing the developed substrate to manufacture the device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-171223, filed Jun. 29, 2007, which is hereby incorporated by reference herein in its entirety.

What is claimed is:

1. An exposure apparatus for exposing a substrate to pulsed light supplied from a light source, the apparatus comprising:
   an input device; and
   a controller configured to periodically change a wavelength of the pulsed light emitted by the light source,
   wherein the controller is configured to calculate number of pulsed light required to expose each point on the substrate based on a parameter input from the input device, and configured to determine a changing period of the wavelength based on the calculated number.

2. An apparatus according to claim 1, wherein letting N be the number of pulsed light required to expose each point on the substrate, and m be a natural number, the controller is configured to determine the changing period of the wavelength as a time during which pulsed light, of which a number is determined based on a value of N/m, are generated.

3. An apparatus according to claim 2, wherein if the value of N/m is not an integer, the controller is configured to determine the changing period of the wavelength as a time during which pulsed light, of which a number is obtained by rounding down, rounding up, or rounding off the value of N/m, are generated.

4. An exposure apparatus for exposing a scanning substrate via a scanning original to slit-shaped exposure light formed from pulsed light supplied from a light source, the apparatus comprising:

an input device; and a controller configured to periodically change a wavelength of the pulsed light emitted by the light source, wherein the controller is configured to set an oscillation frequency of the light source, a speed of scanning of the substrate, and a width of the slit-shaped exposure light in a direction of the scanning based on a parameter input from the input device, and to determine a changing period of the wavelength based on the set values.

5. An apparatus according to claim 4, wherein letting f be the oscillation frequency, v be the speed, L be the width, and m be a natural number, the controller is configured to determine the changing period of the wavelength as a time during which pulsed light of which a number is determined based on a value of $L \cdot f/(v \cdot m)$, are generated.

6. An apparatus according to claim 5, wherein if the value of $L \cdot f/(v \cdot m)$ is not an integer, the controller is configured to determine the changing period of the wavelength as a time during which pulsed light, of which a number is obtained by rounding down, rounding up, or rounding off the value of $L \cdot f/(v \cdot m)$, are generated.

7. A method of manufacturing a device, the method comprising:

exposing a substrate to light using an exposure apparatus defined in claim 1;

developing the exposed substrate; and processing the developed substrate to manufacture the device.

8. A method of manufacturing a device, the method comprising:

exposing a substrate to light using an exposure apparatus defined in claim 4;

developing the exposed substrate; and processing the developed substrate to manufacture the device.

* * * * *